(12) United States Patent
Kim et al.

(10) Patent No.: US 10,056,904 B2
(45) Date of Patent: Aug. 21, 2018

(54) RECEIVER RESILIENT TO NOISE INPUT

(71) Applicants: SK hynix Inc., Icheon (KR); Seoul National University R&DB FOUNDATION, Seoul (KR)

(72) Inventors: Mino Kim, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/620,432

(22) Filed: Jun. 12, 2017

(65) Prior Publication Data

US 2018/0041209 A1    Feb. 8, 2018

(30) Foreign Application Priority Data

Aug. 3, 2016 (KR) .................. 10-2016-0098699

(51) Int. Cl.
| | |
|---|---|
| H03F 3/45 | (2006.01) |
| H03K 19/003 | (2006.01) |
| H03K 3/037 | (2006.01) |
| H03K 19/20 | (2006.01) |
| H03K 5/1252 | (2006.01) |

(52) U.S. Cl.
CPC .......... H03K 19/003 (2013.01); H03K 3/037 (2013.01); H03K 5/1252 (2013.01); H03K 19/20 (2013.01); *H03F 2203/45051* (2013.01)

(58) Field of Classification Search
CPC ....... H03K 3/037; H03K 19/003; H03K 19/20
See application file for complete search history.

(56) References Cited

U.S. PATENT DOCUMENTS

| | | | | |
|---|---|---|---|---|
| 4,504,975 | A * | 3/1985 | Jarret ................... | H04B 10/695 327/76 |
| 5,448,284 | A * | 9/1995 | Matsuda .................. | B41J 2/32 346/135.1 |
| 6,252,435 | B1 * | 6/2001 | Wu ........................ | H03F 3/4521 327/65 |
| 6,275,107 | B1 * | 8/2001 | Maeda ................ | H03F 3/45076 330/253 |
| 6,292,028 | B1 * | 9/2001 | Tomita ................ | H04L 25/0272 326/30 |
| 6,590,429 | B2 * | 7/2003 | Choi ...................... | H03K 5/125 327/563 |
| 6,924,682 | B1 * | 8/2005 | Smith .................. | H03K 3/0375 326/94 |
| 7,778,374 | B2 * | 8/2010 | Jeon ...................... | H04L 25/061 327/51 |
| 8,253,444 | B2 * | 8/2012 | Hayashi .............. | H04L 25/0292 327/563 |

(Continued)

FOREIGN PATENT DOCUMENTS

KR      10-0834119 B1      6/2008

*Primary Examiner* — Alexander H Taningco
*Assistant Examiner* — Kurtis R Bahr

(57) ABSTRACT

A receiver includes a first input buffering circuit configured to output a first signal by comparing an input signal and a first offset signal; a second input buffering circuit configured to output a second signal by comparing the input signal and a second offset signal; and a signal mixing circuit configured to output an output signal with a corrected duty ratio by combining the first signal and the second signal.

9 Claims, 6 Drawing Sheets

(56) References Cited

U.S. PATENT DOCUMENTS

| | | | |
|---|---|---|---|
| 8,358,162 B2 | 1/2013 | Kang | |
| 2008/0186057 A1* | 8/2008 | Daijiro | G01R 23/15 |
| | | | 326/73 |
| 2009/0091354 A1* | 4/2009 | Aoki | H03K 5/1565 |
| | | | 327/65 |
| 2016/0164479 A1* | 6/2016 | Eom | H03D 7/1441 |
| | | | 330/253 |

* cited by examiner

RECEIVER RESILIENT TO NOISE INPUT

CROSS-REFERENCE TO RELATED APPLICATIONS

The present application claims priority to Korean Patent Application No. 10-2016-0098699, filed on Aug. 3, 2016, which is incorporated herein by reference in its entirety.

BACKGROUND

1. Field

Exemplary embodiments of the present disclosure relate to a receiver, and more particularly, to a receiver, which reduces the possibility of a malfunction occurring due to noise applied to an input terminal of the receiver.

2. Description of the Related Art

FIG. 1A shows a conventional receiver 10.

The receiver 10 amplifies a differential signal V1-V2 corresponding to a voltage difference between a first input signal V1 and a second input signal V2, and outputs the amplified differential signal as an output signal OUT.

The output signal OUT output by the receiver 10 has a high voltage level (e.g., a power supply voltage) when a voltage level of the first input signal V1 is greater than that of the second input signal V2, and has a low voltage level (e.g., 0V) when the voltage level of the first input signal V1 is less than or equal to that of the second input signal V2.

FIG. 1B shows a drawback of the receiver 10 of FIG. 1A.

Referring to FIG. 1B, the output signal OUT is output according to the voltage difference between the first and second input signals V1 and V2 during a period when a normal signal is input.

However, noise may be applied to two input terminals of the receiver 10 during periods when no signal is input.

When noise is similarly applied to the two input terminals of the receiver 10 during periods when no signal is input, the voltage difference between the first and second input signals V1 and V2 of the receiver 10 becomes substantially zero, such that a malfunction due to the noise may not occur. The term "noise," as used herein, may refer to a noise component of a current or voltage signal.

However, if noise is applied inconsistently to the two input terminals due to a difference of characteristics of channels connected to the two input terminals, the voltage difference between the first and second input signals V1 and V2 may become temporarily larger than a predetermined value.

In this case, the receiver 10 can amplify the voltage difference between the first and second input signals V1 and V2 due to the differently applied noise, and output an erroneous output signal OUT. The erroneous output signal OUT may cause a malfunction in a system using the output signal OUT of the receiver 10.

SUMMARY

Various embodiments of the present disclosure are directed to a receiver, which can prevent noise from affecting an output signal thereof, the noise being applied to an input terminal of the receiver.

A receiver according to an embodiment may include: a first input buffering circuit configured to output a first signal by comparing an input signal and a first offset signal; a second input buffering circuit configured to output a second signal by comparing the input signal and a second offset signal; and a signal mixing circuit configured to output an output signal with a corrected duty ratio by combining the first signal and the second signal.

A receiver according to an embodiment may substantially prevent the output of any noise by a noise applied to an input terminal of the receiver when a normal signal is not inputted to the receiver.

DETAILED DESCRIPTION

Figure 1A:
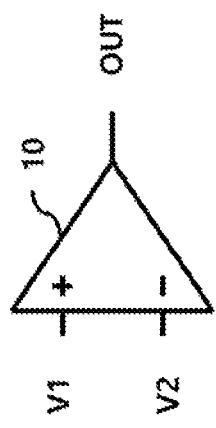
FIG. 1A and FIG. 1B are diagrams illustrating a conventional receiver and a drawback of the conventional receiver, respectively.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

Hereinafter, embodiments will be described with reference to the accompanying drawings.

Figure 2:
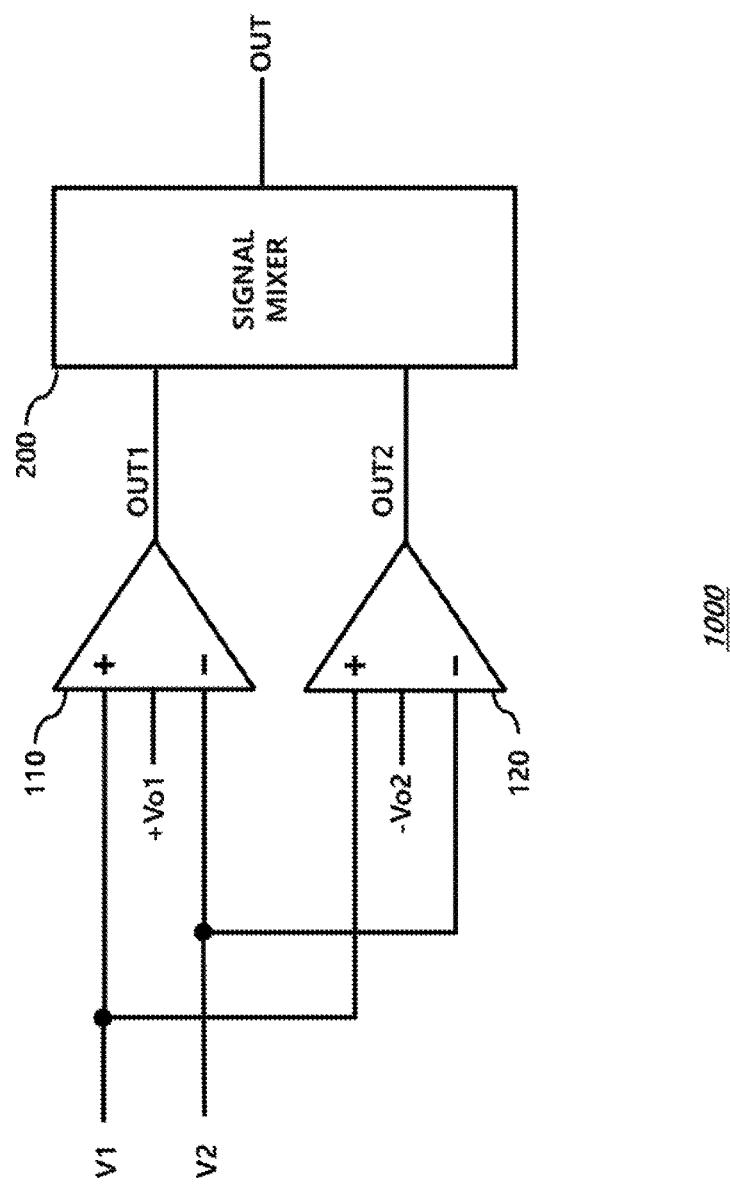
FIG. 2 is a block diagram of a receiver in accordance with an embodiment.

FIG. 2 is a block diagram of a receiver 1000 in accordance with an embodiment of the present disclosure.

The receiver 1000 includes a first input buffer 110, a second input buffer 120, and a signal mixer 200.

The first input buffer 110 and the second input buffer 120 amplify a differential signal V1-V2 corresponding to a voltage difference between a first input signal V1 and a second input signal V2 in consideration of an offset, and output a first signal OUT1 and a second signal OUT2, respectively.

The first input buffer 110 receives a first offset signal +Vo1 having a positive value, and the second input buffer 120 receives a second offset signal −Vo2 having a negative value.

Magnitudes of the first and second offset signals +Vo1 and −Vo2 applied to the first input buffer 110 and the second input buffer 120, respectively, may be set such that duty ratios of the first signal OUT1 and the second signal OUT2 are inverted to each other.

For example, when the duty ratio of the first signal OUT1 is 4:6, the magnitudes of the first and second offset signals +Vo1 and −Vo2 are determined such that the duty ratio of the second signal OUT2 becomes 6:4.

The magnitudes of the first and second offset signals +Vo1 and −Vo2 can be set by a simulation or experiment.

In an embodiment, the magnitudes of the first and second offset signals +Vo1 and −Vo2 may be the same.

The signal mixer 200 combines the first signal OUT1 and the second signal OUT2 to provide an output signal OUT having a duty ratio of 5:5.

FIG. 3A to FIG. 3D are diagrams illustrating operations of the first input buffer 110 and the second input buffer 120.

Figure 3A:
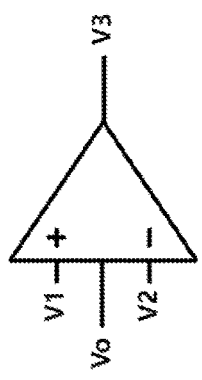
FIG. 3A, 3B, 3C, and FIG. 3D are diagrams illustrating an operation of an input buffer of FIG. 2.

FIG. 3A is a diagram showing any of the first input buffer 110 and the second input buffer 120.

That is, each of the first input buffer 110 and the second input buffer 120 receives the differential signal V1-V2 and an offset signal Vo to generate an output signal V3.

Figure 3B:
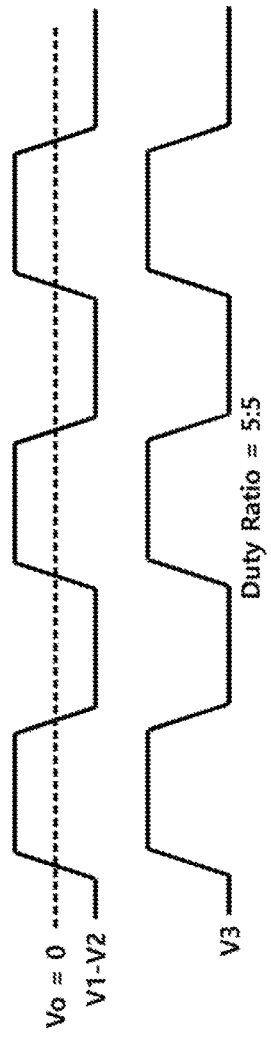

FIG. 3B shows a case where a value of the offset signal Vo is zero.

When the value of the offset signal Vo is 0, the output signal V3 transitions based on a time when the differential signal V1-V2 becomes 0.

Accordingly, a duty ratio of the output signal V3 becomes 5:5, like a duty ratio of the differential signal V1-V2.

Figure 3C:
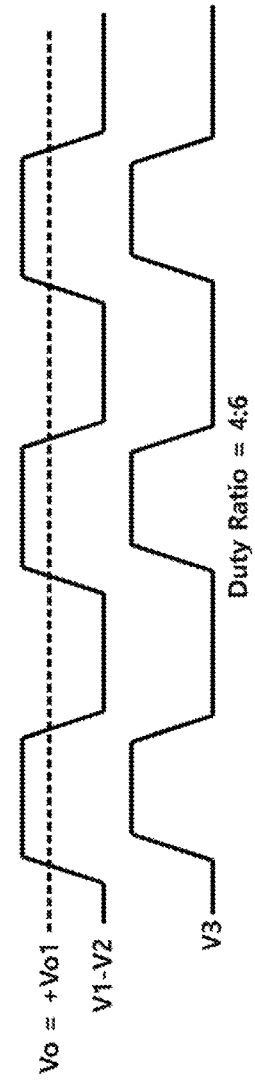

FIG. 3C shows a case where the offset signal Vo has a positive value Vo1.

When the offset signal Vo has the positive value +Vo1, the output signal V3 transitions between levels based on a time when the differential signal V1-V2 becomes +Vo1.

As a result, a width of a high level of the output signal V3 is relatively narrow compared to that of the differential signal V1-V2, and a width of a low level of the output signal V3 is relatively long compared to that of the differential signal V1-V2.

In this process, noise that makes a magnitude of the differential signal V1-V2 smaller than Vo1 can be eliminated.

As shown in FIG. 3C, when the offset signal Vo has the positive value +Vo1, the duty ratio of the output signal V3 may be 4:6.

Figure 3D:
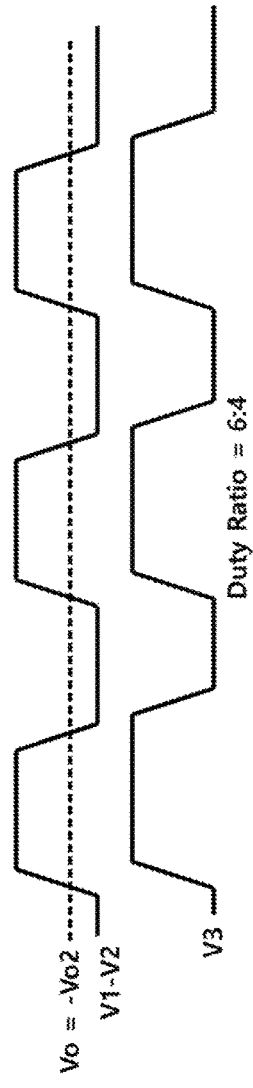

FIG. 3D shows a case where the offset signal Vo has a negative value −Vo2.

When the offset signal Vo has the negative value −Vo2, the output signal V3 transitions based on a time when the differential signal V1-V2 becomes −Vo2.

As a result, a width of the high level of the output signal V3 is relatively enlarged and the width of the low level of the output signal V3 is relatively narrowed.

In this process, noise that makes the magnitude of the differential signal V1-V2 smaller than Vo2 can be eliminated.

As shown in FIG. 3D, when the offset signal Vo has the negative value −Vo2, the duty ratio of the output signal V3 may be 6:4.

As described above, each of the first input buffer 110 and the second input buffer 120 outputs a signal in consideration of an offset signal, thereby suppressing noise when a normal signal is not applied thereto.

However, when a normal signal is applied, the duty ratio of the first signal OUT1 output from the first input buffer 110 and the duty ratio of the second signal OUT2 output from the second input buffer 120 may be distorted by the offset signal Vo.

Therefore, the signal mixer 200 generates the output signal OUT, which has a corrected duty ratio, using the first signal OUT1 and the second signal OUT2.

Figures 4A, 4B:
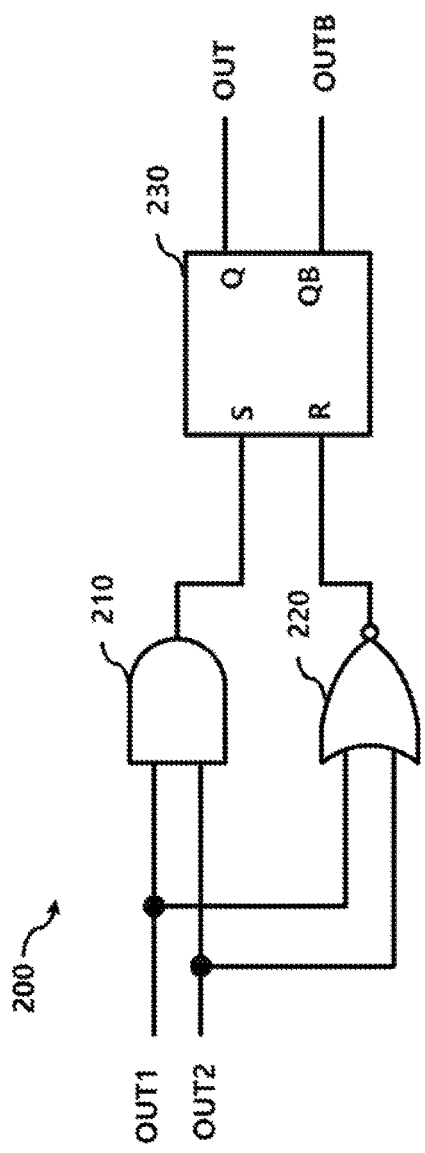
FIG. 4A is a circuit diagram of a signal mixer of FIG. 2 in accordance with an embodiment.
FIG. 4B is a truth table illustrating an operation of the signal mixer of FIG. 4A.

FIG. 4A is a circuit diagram of the signal mixer 200 of FIG. 2 in accordance with an embodiment, and FIG. 4B is a truth table illustrating an operation of the signal mixer 200 in FIG. 4A.

The signal mixer 200 logically combines the first signal OUT1 output from the first input buffer 110 and the second signal OUT2 output from the second input buffer 120, and outputs the output signal OUT and an inverted output signal OUTB.

The signal mixer 200 includes a first logic circuit 210, a second logic circuit 220, and a third logic circuit 230.

The first logic circuit 210 performs an AND operation on the first signal OUT1 and the second signal OUT2.

The second logic circuit 220 performs an NOR operation on the first signal OUT1 and the second signal OUT2.

The third logic circuit 230 is an RS latch including a set input S that is applied with an output signal of the first logic circuit 210 and a reset input R that is applied with an output signal of the second logic circuit 220. The third logic circuit 230 outputs the output signal OUT and the inverted output signal OUTB based on the signals applied to the set input S and the reset input R.

Referring to FIG. 4B, when both of the first signal OUT1 and the second signal OUT2 have a logic low level "0," the output signal of the first logic circuit 210 has a logic low level "0" and the output signal of the second logic circuit 220 has a logic high level "1." Thus, the output signal OUT of the signal mixer 200 has the logic low level "0."

Subsequently, if the first signal OUT1 changes to the logic high level "1," the output signal of the first logic circuit 210 maintains the logic low level "0," and the output signal of the second logic circuit 220 changes to the logic low level "0."

Accordingly, the third logic circuit 230 latches the output signal OUT, and thus the output signal OUT of the third logic circuit 230 maintains the logic low level "0."

In this state, when the second signal OUT2 changes to the logic high level "1," the output signal of the first logic circuit 210 changes to the logic high level "1," and the output signal of the second logic circuit 220 remains at the logic low level "0."

Thus, the output signal OUT of the third logic circuit 230 changes to the logic high level "1."

In this state, when the first signal OUT1 changes to the logic low level "0," the output signal of the first logic circuit 210 changes to the logic low level "0," and the output signal of the second logic circuit 220 remains at the logic low level "0."

Accordingly, the third logic circuit 230 latches the output signal OUT, and thus the output signal OUT of the third logic circuit 230 maintains the logic high level "1."

In this state, when the second signal OUT2 changes to the logic low level "0," the output signal of the first logic circuit 210 maintains the logic low level "0" and the output signal of the second logic circuit 220 changes to the logic high level "1."

Accordingly, the output signal OUT of the third logic circuit 230 changes to the logic low level "0."

Thus, when one of the first signal OUT1 and the second signal OUT2 has the logic high level "1" and the other has the logic low level "0," the output signal OUT maintains its previous state, i.e., the third logic circuit 230 latches the output signal OUT.

Figure 5:
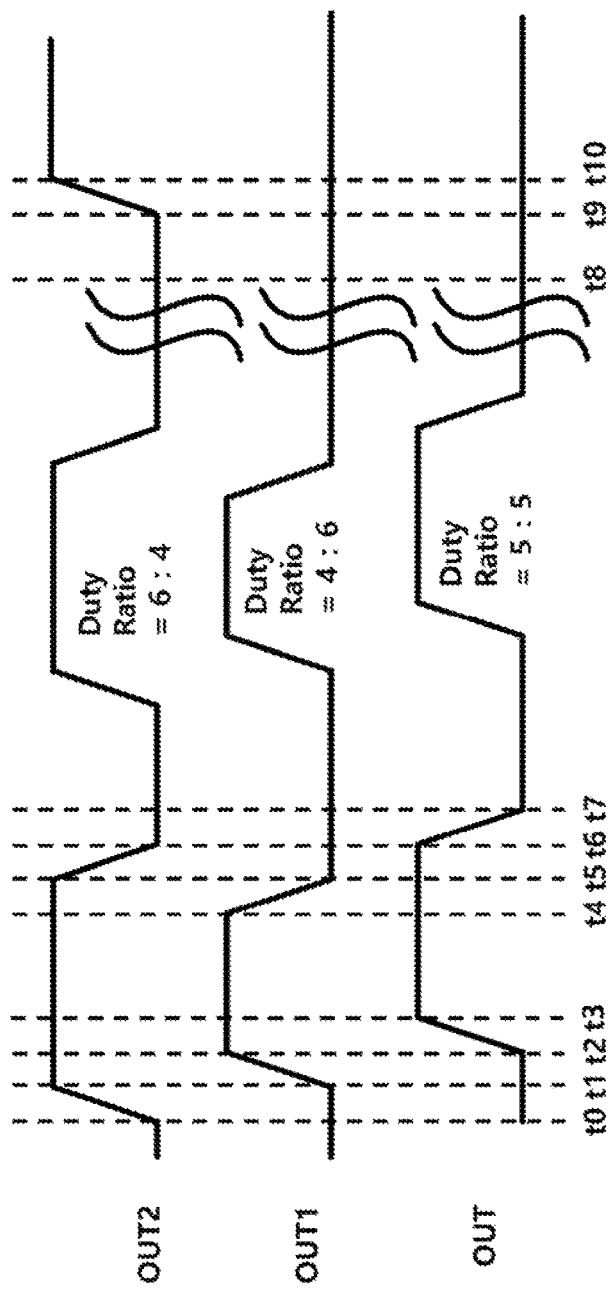
FIG. 5 is a diagram illustrating an operation of the signal mixer of FIG. 4A.

FIG. 5 is a timing diagram illustrating an operation of the signal mixer 200 of FIG. 4.

In this embodiment, the first signal OUT1 has a duty ratio of 4:6 and the second signal OUT2 has a duty ratio of 6:4.

At a time t0, the output signal OUT has a logic low level "0" since the first signal OUT1 has the logic low level "0" and the second signal OUT2 has the logic low level "0."

At a time t1, the second signal OUT2 changes to a logic high level "1," but the first signal OUT1 remains at the logic low level "0," which makes the output signal OUT remain at the logic low level "0."

At a time t2, the first signal OUT1 changes to the logic high level "1" and the second signal OUT2 maintains the logic high level "1." Therefore, the output signal OUT starts to transition and changes to the logic high level "1" at a time t3.

At a time t4, the first signal OUT1 begins to transition to the logic low level "0," and the first signal OUT1 changes to the logic low level "0" at a time t5.

At the time t5, although the first signal OUT1 has the logic low level "0," the second signal OUT2 still has the logic high level "1," such that the output signal OUT remains at the logic high level "1."

When the second signal OUT2 changes to the logic low level "0" at a time t6, the output signal OUT starts to transition and changes to the logic low level "0" at a time t7.

Then, the above-described operation is repeated. That is, the output signal OUT transitions to the logic high level "1" when the first signal OUT1 changes to the logic high level "1," and transitions to the logic low level "0" when the second signal OUT2 changes to the logic low level "0."

Through this operation, the duty ratio of the output signal OUT converges to 5:5.

After a time t8, an operation in which a normal signal is not input as the first input signal V1 and the second input signal V2 will be described.

In the absence of noise, when the normal signal is not input to the receiver 1000, the output signal OUT remains at the logic low level "0."

The first input buffer 110 outputs the first signal OUT1 as the logic low level "0" under the condition that the differential signal V1-V2 is smaller than the first offset +Vo1.

The second input buffer 120 outputs the second signal OUT2 as the logic high level "1" under the condition that the differential signal V1-V2 is smaller than the first offset Vo1 but larger than the second offset −Vo2.

Accordingly, the second signal OUT2 can change to the logic high level "1" even though the first signal OUT1 still remains at the logic low level "0."

At a time t9, the first signal OUT1 maintains the logic low level "0" but the second signal OUT2 starts to transition to the logic high level "1," and thus the second signal OUT2 changes to the logic high level "1" at a time t10.

Since the output signal OUT has the logic low level "0" at the time t8, even if the second signal OUT2 changes to the logic high level "1" at the time t10, the output signal OUT keeps the logic low level "0" because the first signal OUT1 still has the logic low level "0."

Figure 6:
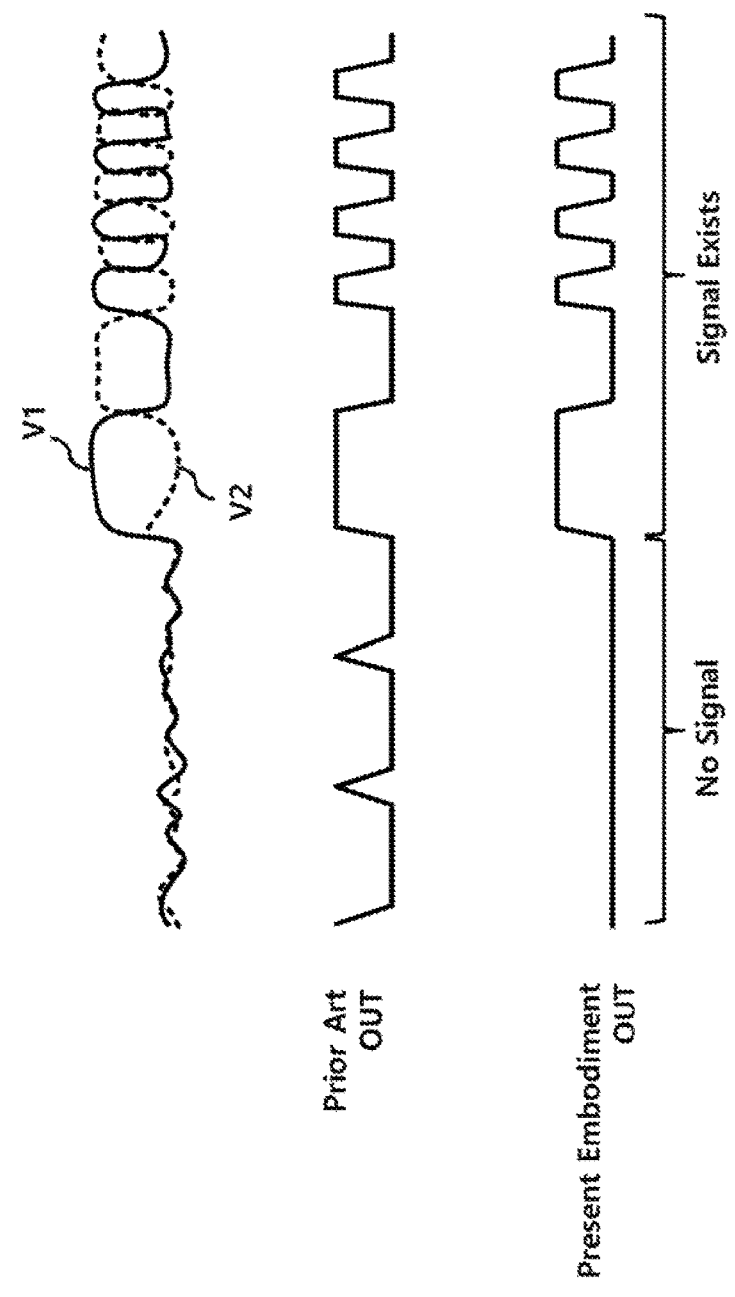
FIG. 6 is a diagram illustrating an operation of a receiver according to an embodiment.

FIG. 6 is a diagram for illustrating an operation of the receiver 1000 illustrated in FIG. 2 according to an embodiment.

Figure 1B:
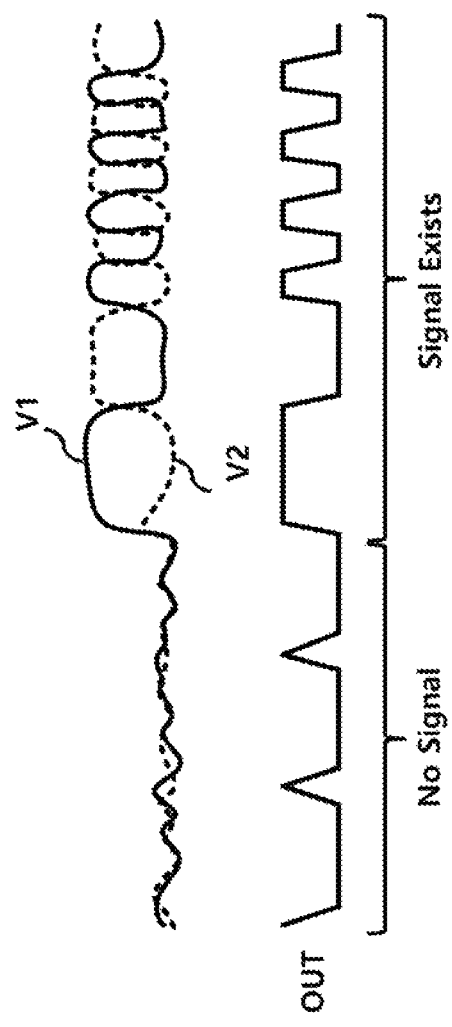

As shown in FIGS. 1A and 1B, in the conventional receiver 10, noise applied to an input terminal may be amplified and output in a period in which a normal signal is not applied to both the first input signal V1 and the second input signal V2.

However, in the receiver 1000 according to the embodiment, no noise is generated in an output terminal in a section where a normal signal is not input, so that a malfunction of a device using the output signal OUT of the receiver 1000 can be prevented.

In addition, in a period during which a normal signal is input, the duty ratio of the output signal OUT can be controlled not to be distorted through the signal mixing.

Although various embodiments have been described for illustrative purposes, it will be apparent to those skilled in the art that various changes and modifications may be made without departing from the spirit and scope of the invention as defined in the following claims.

What is claimed is:

1. A receiver comprising:
   a first input buffering circuit configured to output a first signal according to an input signal and a first offset signal;
   a second input buffering circuit configured to output a second signal according to the input signal and a second offset signal; and
   a signal mixing circuit configured to output an output signal with a corrected duty ratio by combining the first signal and the second signal,
   wherein, in the first input buffering circuit, a voltage level of a first reference signal is adjusted to a first voltage level according to the first offset signal, the first reference signal being compared with the input signal,
   wherein, in the second buffering circuit, a voltage level of a second reference signal is adjusted to a second voltage level according to the second offset signal, the second reference signal being compared with the input signal,
   wherein the input signal corresponds to a difference of a first input signal and a second input signal, and
   wherein the first input buffering circuit rejects noise in the input signal when the difference between the first input signal and the second input signal is smaller than a magnitude of the first offset signal, and the second input buffering circuit rejects noise in the input signal when the difference between the first input signal and the second input signal is smaller than a magnitude of the second offset signal.

2. The receiver of claim 1, wherein the first input buffering circuit outputs the first signal, the first signal having a first level when a voltage level of the input signal is greater than the first voltage level, the first signal having a second level when the voltage level of the input signal is less than or equal to the first voltage level, and
   wherein the second input buffering circuit outputs the second signal, the second signal having the first level when the voltage level of the input signal is greater than the second voltage level, the second signal having the second level when the voltage level of the input signal is less than or equal to the second voltage level.

3. The receiver of claim 1, wherein one of the first offset signal and the second offset signal has a positive value and the other of the first offset signal and the second offset signal has a negative value.

4. The receiver of claim 3, wherein a magnitude of the first offset signal and a magnitude of the second offset signal are the same.

5. The receiver of claim 1, wherein a duty ratio of the first signal is the inverse of a duty ratio of the second signal.

6. The receiver of claim 1, wherein when the first signal and the second signal have a same level, the signal mixing circuit outputs the output signal with the same level as the level of the first and second signals, and
   wherein when the first signal and the second signal have different levels, the signal mixing circuit maintains a previous level of the output signal.

7. The receiver of claim 1, wherein the signal mixing circuit comprises:
   a first logic circuit configured to logically combine the first signal and the second signal;

a second logic circuit configured to logically combine the first signal and the second signal; and a third logic circuit configured to generate the output signal based on outputs of the first and second logic circuits.

8. The receiver of claim 7, wherein the first logic circuit is an AND gate, the second logic circuit is a NOR gate, and the third logic circuit is an SR Latch.

9. The receiver of claim 1, wherein the magnitudes of the first and second offset signals are set by a simulation or experiment.

* * * * *